(12) United States Patent
Al-Sehemi et al.

(10) Patent No.: US 12,490,571 B2
(45) Date of Patent: Dec. 2, 2025

(54) THIN-FILM SENSOR AND METHOD OF FABRICATING THIN-FILM SENSOR

(71) Applicant: King Khalid University, Abha (SA)

(72) Inventors: Abdullah G. Al-Sehemi, Abha (SA); Richard O. Ocaya, Phuthaditjhaba (ZA); Fahrettin Yakuphanoglu, Elazig (TR); Ahmed A. Al-Ghamdi, Jeddah (SA); Mohammed A. Assiri, Abha (SA); Mehboobali Pannipara, Abha (SA)

(73) Assignee: King Khalid University, RCAMS, Abha (SA)

( * ) Notice: Subject to any disclaimer, the term of this patent is extended or adjusted under 35 U.S.C. 154(b) by 541 days.

(21) Appl. No.: 18/053,871

(22) Filed: Nov. 9, 2022

(65) Prior Publication Data

US 2024/0155852 A1    May 9, 2024

(51) Int. Cl.
| | |
|---|---|
| *H10K 30/00* | (2023.01) |
| *H10K 30/81* | (2023.01) |
| *H10K 71/12* | (2023.01) |
| *H10K 71/40* | (2023.01) |
| *H10K 71/60* | (2023.01) |

(52) U.S. Cl.
CPC ........... *H10K 30/451* (2023.02); *H10K 30/81* (2023.02); *H10K 71/12* (2023.02); *H10K 71/40* (2023.02); *H10K 71/60* (2023.02)

(58) Field of Classification Search
CPC .................................................. H10K 30/451
USPC ............................................................ 257/40
See application file for complete search history.

(56) References Cited

U.S. PATENT DOCUMENTS

| | | | |
|---|---|---|---|
| 2010/0044702 A1* | 2/2010 | Urayama | H10D 30/6755 257/43 |
| 2012/0318058 A1* | 12/2012 | Kimura | G01L 19/0092 374/1 |
| 2012/0322167 A1* | 12/2012 | Lai | A61B 5/1486 438/1 |

* cited by examiner

*Primary Examiner* — Ajay Arora
(74) *Attorney, Agent, or Firm* — AVEK IP, LLC

(57) ABSTRACT

The present disclosure provides a thin-film sensor including a top layer passivation including top electrical contacts; an active layer disposed under the top layer, the active layer including an active material; a bottom layer passivation disposed below the active layer and including bottom electrical contacts; and a semiconductor layer disposed around the active layer, such that the semiconducting layer sandwiches the active layer.

7 Claims, 24 Drawing Sheets

THIN-FILM SENSOR AND METHOD OF FABRICATING THIN-FILM SENSOR

TECHNICAL FIELD

The present disclosure generally relates to a thin film sensor. In particular, the present disclosure relates to a thin film sensor for cryogenic applications.

BACKGROUND

Background description includes information that may be useful in understanding the present invention. It is not an admission that any of the information provided herein is prior art or relevant to the presently claimed invention, or that any publication specifically or implicitly referenced is prior art.

A Schottky diode is a semiconducting layer overlaid with a patterned, apertured conductive film. A majority electron current is generated between the conductive film and the semiconductor layer, in response to incident phonons. The conductive film is provided to lead out the generated current. Dimensions of detection surfaces are typically smaller than wavelengths of the incident phonon. The construction of the Schottky sensor begins on a substrate material, which is also metallized to provide a current return path.

In recent years, organic semiconductors (OSC) have moved towards center stage. These materials are designed to emulate either n-type or p-type behavior by the relative configuration with other materials, through tuning of molecular orbitals, leading to the postulation of sensor behavior through the concept of highest and lowest unoccupied molecular orbitals (HUMO/LUMO, respectively. Various apertured thin film Schottky diode-based sensors have been designed for different detection applications. Substrates of these sensors have ranged from conventional silicon to more unconventional atoms like diamond (carbon) and other compound substrates.

There is a requirement in the art for a cryogenic detector with improved stability of operation.

OBJECTS OF INVENTION

An object of the present invention is to provide a thin film sensor for cryogenic applications.

Another object of the present invention is to provide a thin film sensor for photoconductive and photovoltaic mode operation.

Another object of the present invention is to provide a thin film sensor for cryogenic applications with improved stability of operations.

Another object of the present invention is to provide a method for fabricating a thin film sensor for cryogenic applications.

SUMMARY

The present disclosure generally relates to a thin film sensor. In particular, the present disclosure relates to a thin film sensor for cryogenic applications.

In an aspect, the present disclosure provides a thin-film sensor including a top layer passivation including top electrical contacts. The thin-film sensor further includes an active layer disposed under the top layer, the active layer including an active material. The thin-film sensor further includes a bottom layer passivation disposed below the active layer and including bottom electrical contacts. The thin-film sensor further includes a semiconductor layer disposed around the active layer, such that the semiconducting layer sandwiches the active layer.

In some embodiments, the top electrical contacts are metallized with aluminum.

In some embodiments, the bottom electrical contacts are metallized with gold.

In some embodiments, the active material includes graphitic carbon nitride.

In some embodiments, the semiconductor layer includes Silicon.

In some embodiments, the thin-film sensor works in a temperature range from about 50 K to about 500 K.

In some embodiments, the thin-film sensor is operable in forward and reverse bias.

In another aspect, the present disclosure provides a method of fabricating a thin-film sensor. The method includes providing a solution comprising a pre-cursor for an active material of the thin-film sensor. The method further includes providing a substrate. The method further includes depositing the solution comprising the pre-cursor for the active material onto the substrate, wherein the deposition occurs one or more times. The method further includes annealing the deposited substrate in a pre-defined atmosphere, at a predetermined temperature for a predetermined duration of time to provide a thin-film on the substrate. The method further includes depositing top and bottom electrical contacts on the substrate comprising the thin-film.

In some embodiments, the solution comprises a mixture of hexamethylenetetramine and urea.

In some embodiments, the solution is deposited on the substrate by spin-coating.

In some embodiments, the pre-defined atmosphere comprises nitrogen.

In some embodiments, the top and bottom electrical contacts are deposited by evaporation.

Various objects, features, aspects, and advantages of the inventive subject matter will become more apparent from the following detailed description of preferred embodiments, along with the accompanying drawing figures in which like numerals represent like components.

BRIEF DESCRIPTION OF DRAWINGS

The accompanying drawings are included to provide a further understanding of the present disclosure and are incorporated in and constitute a part of this specification. The drawings illustrate exemplary embodiments of the present disclosure and, together with the description, serve to explain the principles of the present disclosure.

DETAILED DESCRIPTION

Figure 1A:
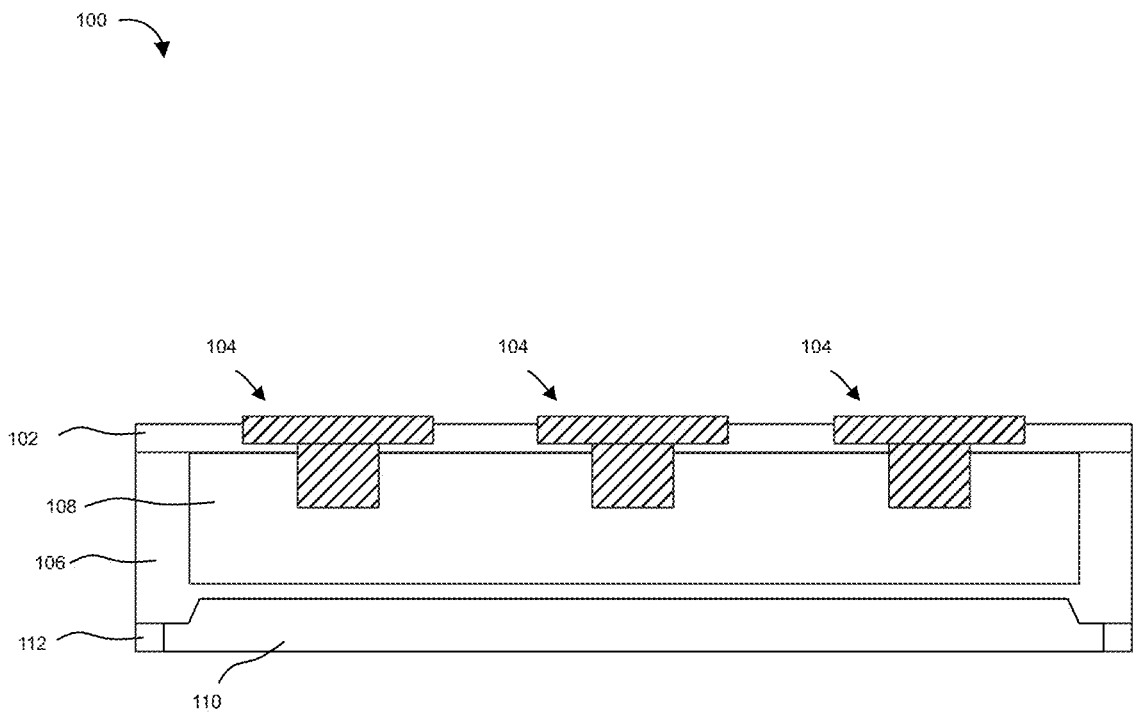
FIG. 1A illustrates a schematic sectional view of a thin film sensor, according to an embodiment of the present disclosure.

The following is a detailed description of embodiments of the disclosure depicted in the accompanying drawings. The embodiments are in such details as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Conventional semiconductor cryogenic sensors are prone to undergoing thermal shock arising from differential contraction of various components of the sensor at cryogenic temperatures, which can generate mechanical stresses and strains that negatively impact carrier transport in the material and, thus, the sensor response. The self-heating that arises from the electrical stimulation of passively configured sensors affects the heat flow dynamics between the sensor, housing, and the sensed environment. It is accentuated by a high, often strongly nonlinear temperature-dependent function of device series resistance, with the latter inextricably linked to the other inherent device parameters. These variations may directly impact the reverse saturation current and other device parameters.

Similar sensor thermal response times are typically in the millisecond range at 4 K, but there exist values in the lower microsecond range for some reported silicon diodes. In measurements, contingency involves managing the problem by reducing the stimulation energy. Known solutions involve specially designed sensor semiconductors, low thermal-mass encapsulation for faster response, special, periodic conditioning circuits, and periodic multipoint recalibration. These solutions can compromise the detection floor of the sensor.

In an aspect, the present disclosure provides a thin-film sensor including a top layer passivation including top electrical contacts. The thin-film sensor further includes an active layer disposed under the top layer, the active layer including an active material. The thin-film sensor further includes a bottom layer passivation disposed below the active layer and including bottom electrical contacts. The thin-film sensor further includes a semiconductor layer disposed around the active layer, such that the semiconducting layer sandwiches the active layer.

In some embodiments, the top electrical contacts are metallized with aluminum.

In some embodiments, the bottom electrical contacts are metallized with gold.

In some embodiments, the active material includes graphitic carbon nitride.

In some embodiments, the semiconductor layer includes Silicon.

In some embodiments, the thin-film sensor works in a temperature range from about 50 K to about 500 K.

In some embodiments, the thin-film sensor is operable in forward and reverse bias.

In another aspect, the present disclosure provides a method of fabricating a thin-film sensor. The method includes providing a solution comprising a pre-cursor for an active material of the thin-film sensor. The method further includes providing a substrate. The method further includes depositing the solution comprising the pre-cursor for the active material onto the substrate, wherein the deposition occurs one or more times. The method further includes annealing the deposited substrate in a pre-defined atmosphere, at a predetermined temperature for a predetermined duration of time to provide a thin-film on the substrate. The method further includes depositing top and bottom electrical contacts on the substrate comprising the thin-film.

In some embodiments, the solution comprises a mixture of hexamethylenetetramine and urea.

In some embodiments, the solution is deposited on the substrate by spin-coating.

In some embodiments, the pre-defined atmosphere comprises nitrogen.

In some embodiments, the top and bottom electrical contacts are deposited by evaporation.

The present disclosure provides a thin film device with low variance series resistance of low value that minimizes self-heating under passive stimulation. The ideality-factor adjusted thermal voltage is near constant such that the inherent charge carries experience the same barrier energy over the 50 K to 500 K range of measurement, with a highly linear output response as further described herein. Thermal robustness to pressures of up to 500 GPa at both measurement temperature extremes is assured by the employed graphitic carbon materials, the configuration, and the encapsulation thereof, leading to an excellent response time.

FIG. 1A illustrates a schematic sectional view of a thin film sensor 100, according to an embodiment of the present disclosure.

Figure 1B:
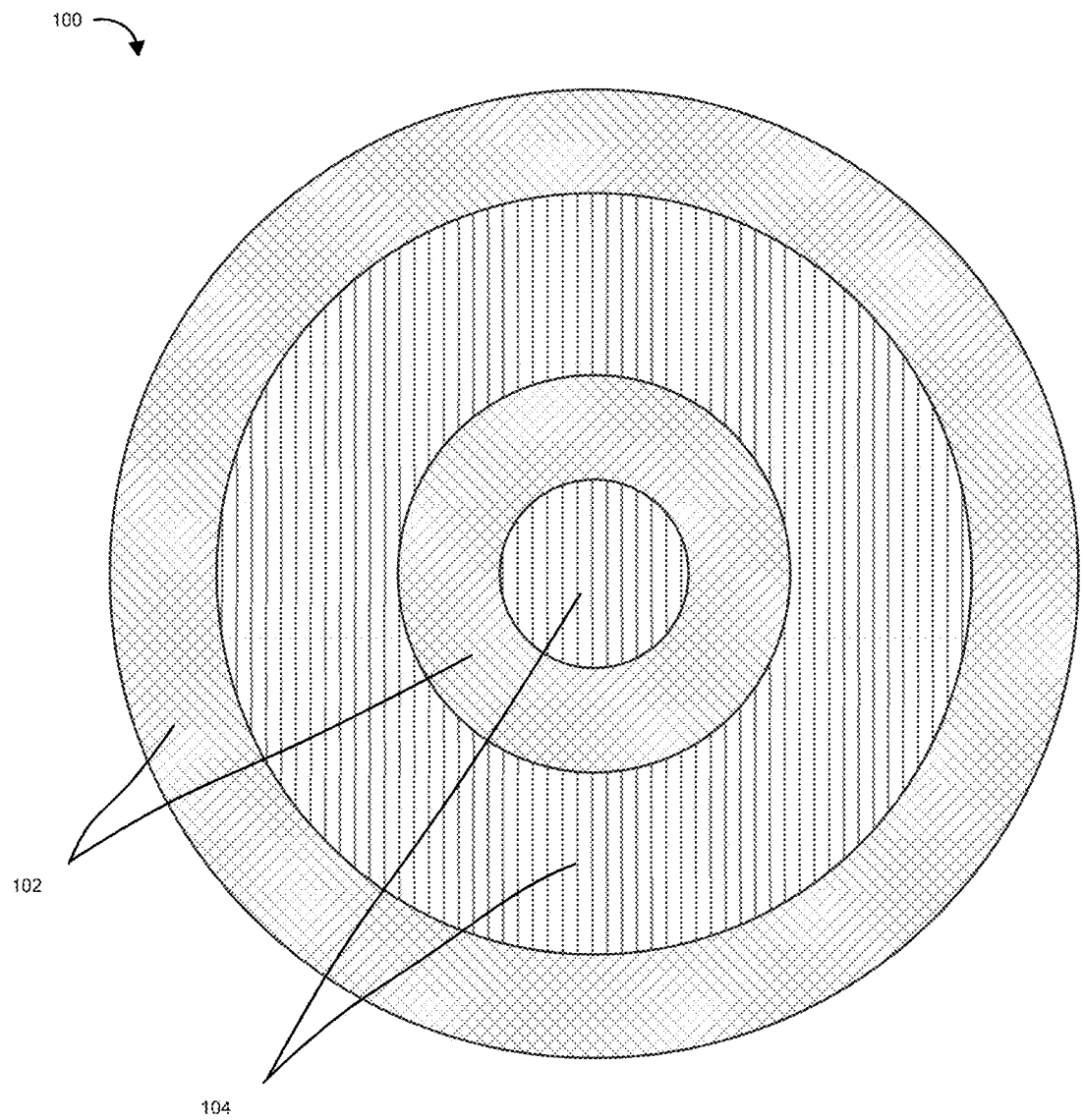
FIG. 1B illustrates a schematic top view of the thin film sensor, according to an embodiment of the present disclosure.

FIG. 1B illustrates a schematic top view of the thin film sensor 100, according to an embodiment of the present disclosure.

Figure 1C:
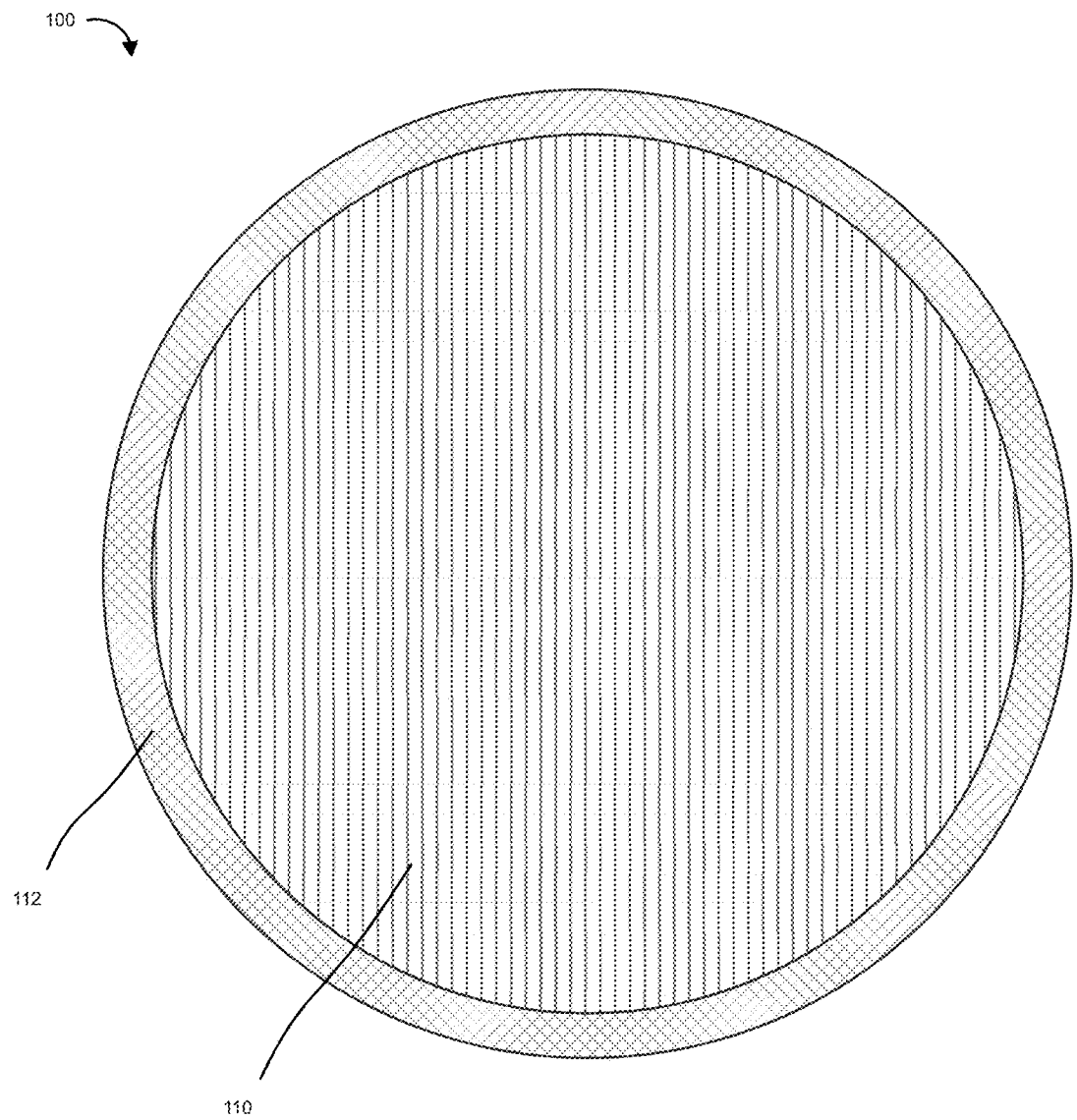
FIG. 1C illustrates a schematic bottom view of the thin film sensor, according to an embodiment of the present disclosure.

FIG. 1C illustrates a schematic bottom view of the thin film sensor 100, according to an embodiment of the present disclosure.

Referring now to FIGS. 1A to 1C, the sensor 100 may be a Schottky diode. The sensor 100 includes a top layer passivation 102 of a diode p-layer with $SiO_2$. The top layer passivation 102 may have a preferable aluminum metallization to provide top electrical contacts 104. The contacts 104 are provided on the p-type $SiO_2$ layer 106. The sensor 100 further include aluminum metallization 114 provided to the top electrical contacts 104.

The p-type $SiO_2$ layer 106 sandwiches an active layer 108. The active layer 108 includes graphitic carbon nitride ($g$-$C_3N_4$) (CN). The active layer 108 including the CN and the p-type $SiO_2$ layer 106 together implement an active n-type semiconductor stack.

The sensor 100 further includes a gold metallization 110 provided at bottom electrical contacts for a bottom of the sensor 100. A passivation layer of $SiO_2$ 112 is provided around each of the electrical contacts at the bottom. The passivation is provided as termination order for the p-type crystal material, which limits the effects of interface states due to surface discontinuities.

Figure 2:
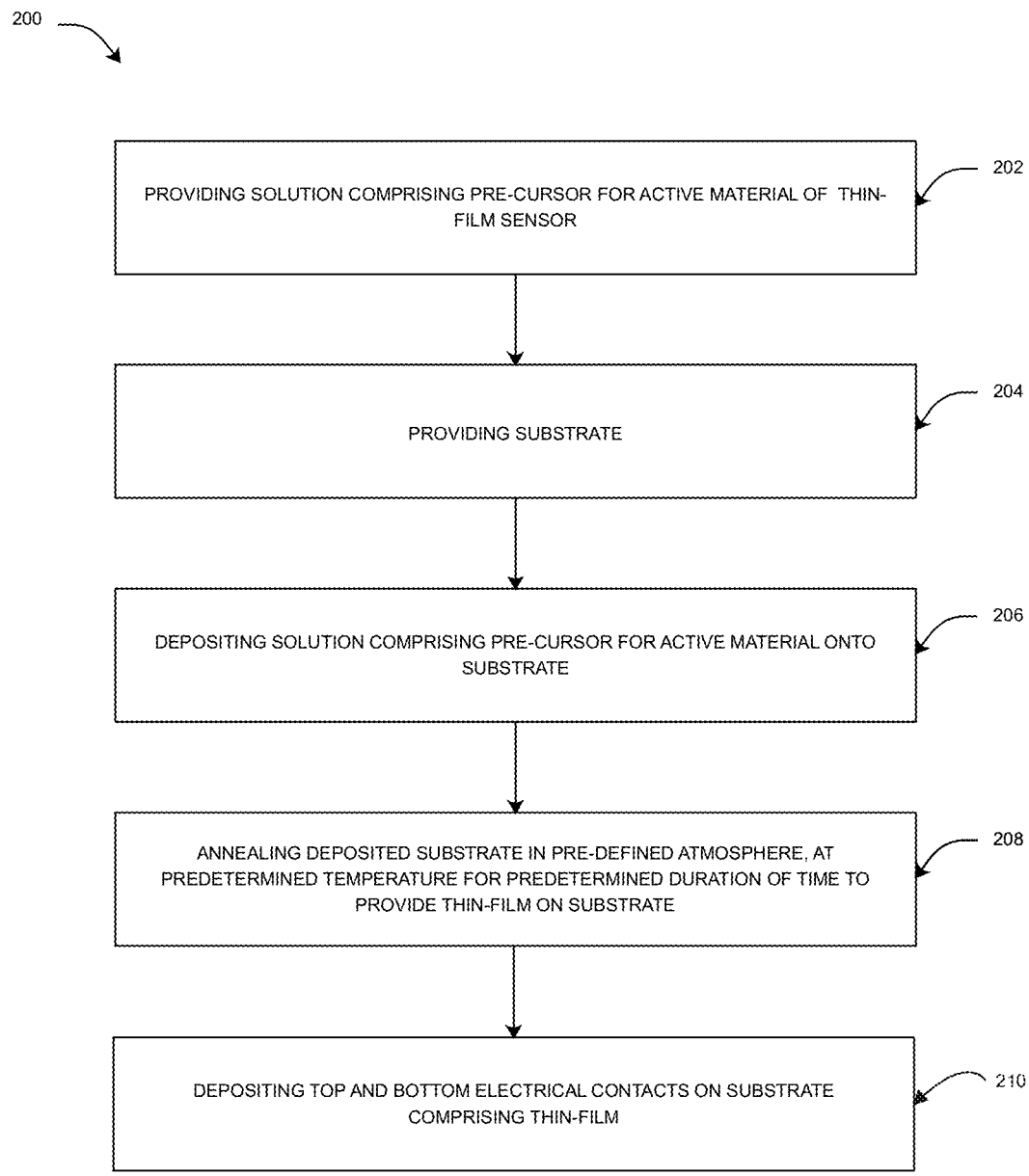
FIG. 2 illustrates a schematic flow diagram for a method to manufacture the film sensor 100, according to an embodiment of the present disclosure.

FIG. 2 illustrates a schematic flow diagram for a method 200 to manufacture the film sensor 100, according to an embodiment of the present disclosure. At step 202, the method 200 includes providing a solution comprising a pre-cursor for an active material of the thin-film sensor. At step 204, the method 200 further includes providing a substrate. At step 206, the method 200 further includes depositing the solution comprising the pre-cursor for the active material onto the substrate, wherein the deposition occurs one or more times. At step 208, the method 200 further includes annealing the deposited substrate in a pre-defined atmosphere, at a predetermined temperature for a predetermined duration of time to provide a thin-film on the substrate. At step 210, the method 200 further includes depositing top and bottom electrical contacts on the substrate comprising the thin-film.

The CN film is deposited on the p-silicon wafer using a sol-gel spin coating method. Hexamethylenetetramine and urea are used as precursors for this coating. Prior to deposition of the CN film, the silicon substrate (600 μm in thickness, 5-10 Ωcm resistivity, and <111> orientation) is chemically etched by the solution of HF for 1 min and then ultrasonicated in re-distilled water for 10 to 15 minutes. The aqueous solution of hexamethylenetetramine and aqueous solution of urea (1:1 M) is mixed at room temperature and aged for about one hour. The resulting solution is spin coated on the silicon substrate at 2000 rpm. After each coating, the deposited sol is dried at 150° C. for 10 minutes to obtain a solid thin-film. The coating procedure is repeated for about 5 times. Finally, the substrate is heated at 600° C. for 30 minutes under $N_2$ atmosphere. After coating of the film, a circular top contact of 3.14 $cm^2$ area is made by evaporating gold using physical mask. Aluminum as bottom contact on silicon wafer is coated using the same technique.

Figure 3:
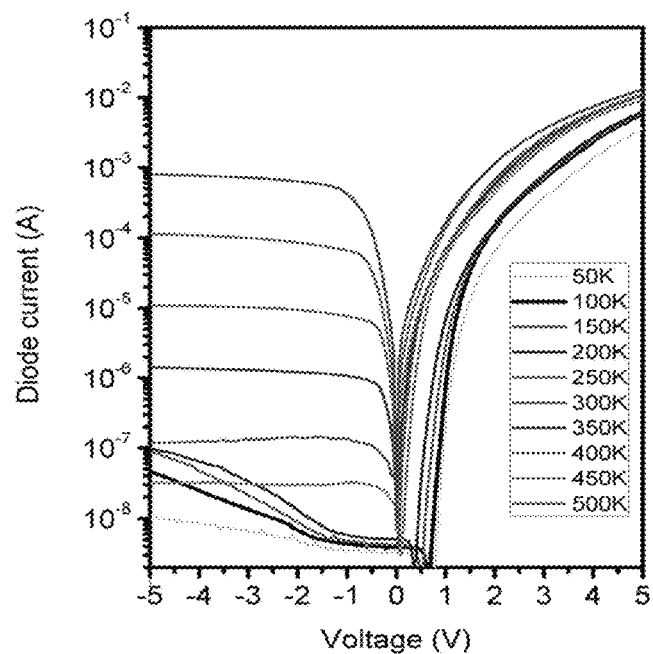
FIGS. 3 to 5 illustrate exemplary plots depicting I-V characteristics of the sensor at various temperatures.
Figure 4:
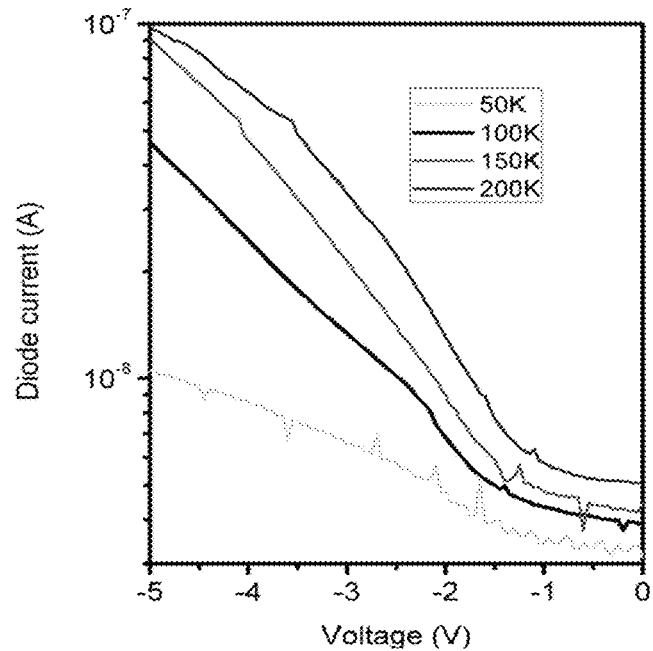
Figure 5:
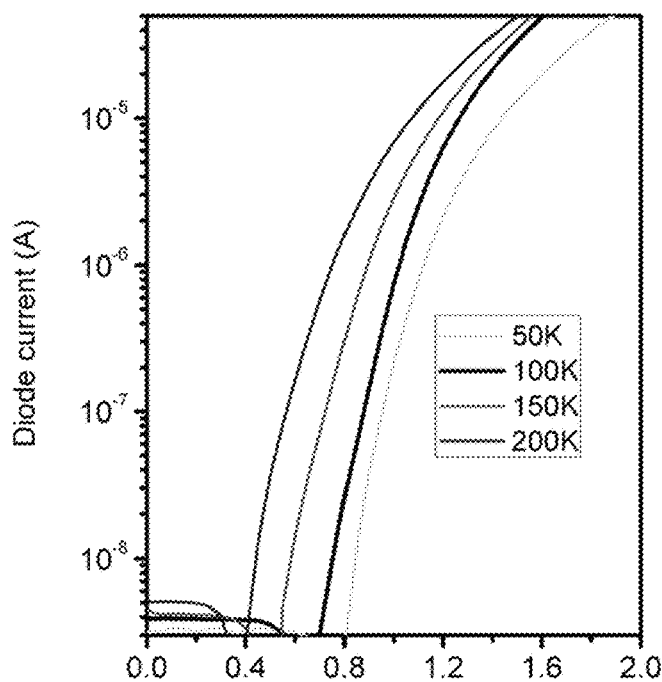

FIGS. 3 to 5 illustrate exemplary plots 300, 400, 500 depicting I-V characteristics of the sensor 100 at various temperatures. The temperature was varied from about 50 K to about 500 K. the I-V characteristics show non-linear behavior with rectification. The forward bias current increases exponentially with voltage. Thus, the sensor 100 implements a rectifying Schottky junction. The I-V characteristics of the diode has been established to follow thermionic emission, given by, $$I = AA^*T^2 \exp\left(-\frac{q\Phi_b}{k_BT}\right)\exp\left(\frac{q(V-IR_s)}{\eta k_BT}\right),$$

where V is the applied voltage, q is the electronic charge, η is the ideality factor, $k_B$ is the Boltzmann constant, T is absolute temperature and $R_s$ is the diode series resistance. A is the area of the diode junction, A* is the effective Richardson constant, which has been established through the modified Richardson plot to be equal to 32 A/$cm^2K^2$, confirming the figure for p-type silicon substrate on which the diode was fabricated.

Figure 6:
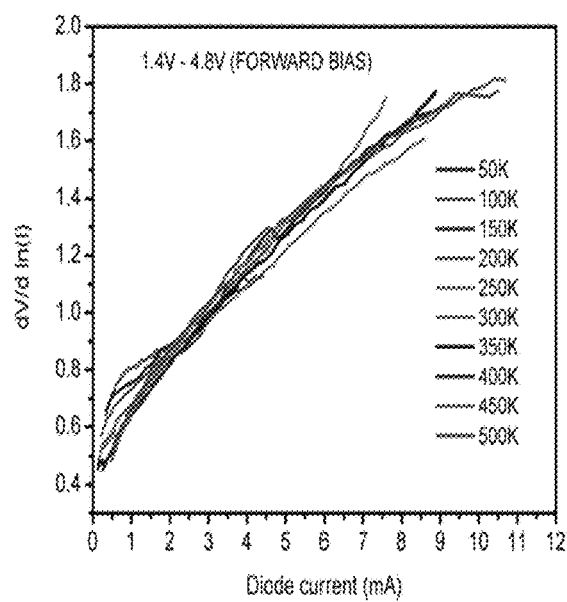
FIGS. 6 and 7 illustrate exemplary plots depicting differential variation for barrier height and forward resistance calculation for the sensor.
Figure 7:
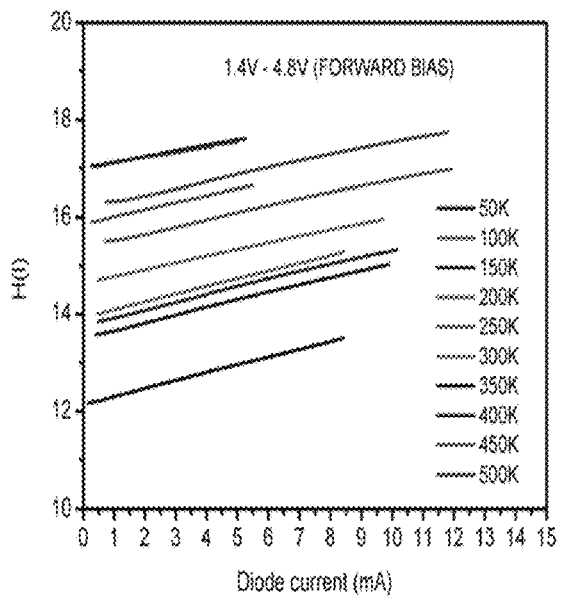

FIGS. 6 and 7 illustrate exemplary plots 600, 700 depicting differential variation for barrier height and forward resistance calculation for the sensor 100. Specifically, the plots 600, 700 depict implementations of the Cheung-Cheung method for the determination of Schottky diode properties, specifically the series resistance and the barrier height.

Figure 8:
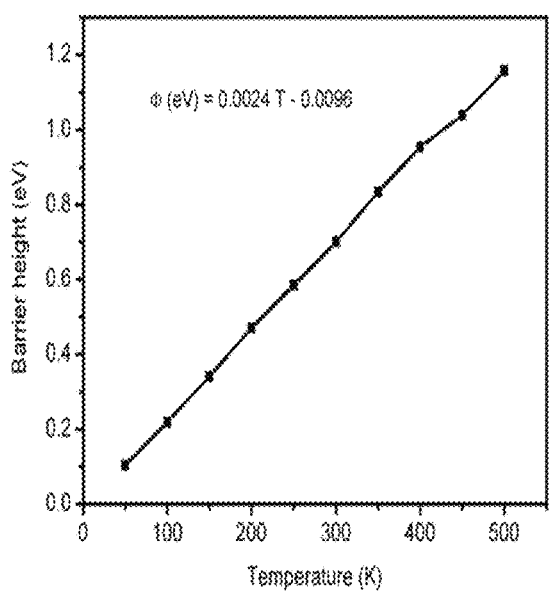
FIG. 8 illustrates an exemplary plot depicting variation in barrier height with temperature.

FIG. 8 illustrates an exemplary plot 800 depicting variation in barrier height with temperature. Referring now to FIGS. 6 to 8, the variation in barrier height with temperature of the sensor 100 is found to be linear. The barrier height may be calculated as below, $$P(\Phi_b) = \frac{1}{\sigma\sqrt{2\pi}}\exp\left(-\frac{(\Phi_b - \overline{\Phi}_b)^2}{2\sigma^2}\right),$$

where $\overline{\Phi}_b$ is the average barrier height and σ is the standard deviation in $\Phi_b$. The standard deviation is taken to be the result of barrier height inhomogeneities which is known to depend on applied diode voltage and temperature. The barrier height, $\Phi_{b,0}$ determined under zero applied bias may be expressed solely in terms of temperature, so that the apparent barrier height ($\Phi_{ap}$) and the apparent ideality factor ($\eta_{ap}$) at T=0K may be written as, $$\Phi_{ap} = \overline{\Phi}_{b,0} - \frac{q\sigma_0^2}{2kT},$$

$$\frac{1}{\eta_{ap}} - 1 = \rho - \frac{q\gamma^2}{2kT}.$$

Figure 9:
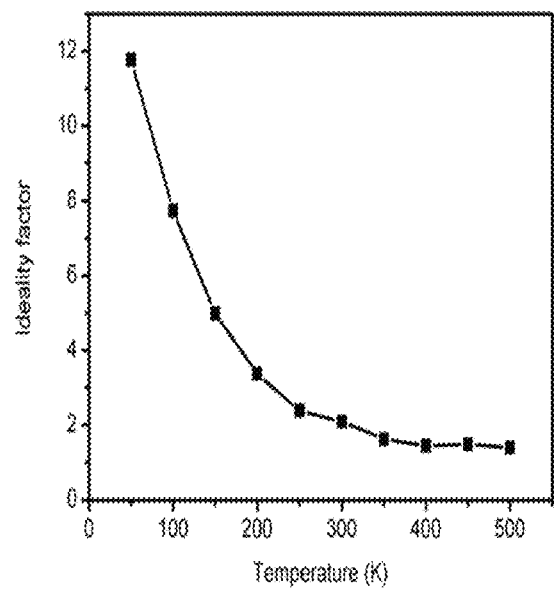
FIG. 9 illustrates an exemplary plot depicting ideality factor of the sensor as a function of temperature.

FIG. 9 illustrates an exemplary plot 900 depicting ideality factor of the sensor 100 as a function of temperature. The ideality factor may be calculated as below, $$\eta = \frac{q}{kT}\frac{dV}{d\ln I}$$

Figure 10:
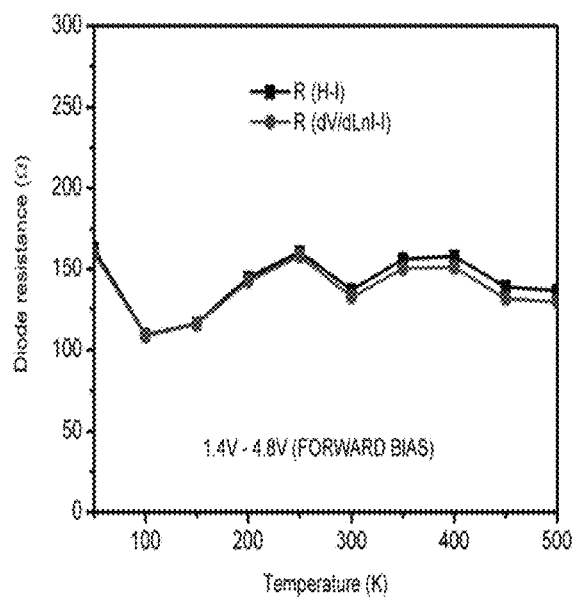
FIG. 10 illustrates an exemplary plot depicting calculated series resistance of the sensor.

FIG. 10 illustrates an exemplary plot 1000 depicting calculated series resistance of the sensor 100. The series resistance is calculated as below, $$\Phi_b = \overline{\Phi}_{b,0} + \gamma V$$

where the parameter ρ and the standard deviation γ are coefficients of the applied voltage bias. The above equation is accepted to adequately describe the variation of the barrier height as a linear function of the applied bias under thermal equilibrium, where the coefficient γ is a function of temperature. Thus, the actual variation of barrier height is a complex function, and it is normal to report it at zero bias, and at a specific temperature to convey its essential aspects.

Furthermore, the current-voltage characteristics of the Al/p-Si/C3N4/Au Schottky diode strongly depend on the temperature. The reverse bias current of the Al/p-Si/C3N4/Au Schottky diode increases linearly with temperature. The temperature coefficients of current and voltage are predictable.

The capacitance of a heterostructure MIS junction based diode comprises of two aspects, namely the depletion layer capacitance C, and the diffusion capacitance, $C_d$. Capacitance $C_d$ is directly correlates with the minority lifetime and is given by, $$C_d = \frac{q^2 n_i^2 L_n}{kT N_A} \exp\left(\frac{qcV}{kT}\right)$$

where c is a constant, $L_n$ is the excess minority diffusion length, $N_A$ is the non-compensated ionized acceptor concentration of the p-type silicon.

The built-in potential $V_{bi}$ is an important parameter of a semiconductor diode. In thermal equilibrium $V_{bi}$ equals the potential across the depletion region. Thermal equilibrium itself implies that the Fermi energy, is constant throughout the junction, further implying that the internal potential equals the difference between the Fermi energies of each region, from metal ($E_{F,m}$) to semiconductor ($E_{F,S}$). For true thermal equilibrium to exist across the junction, it must match the sum of the bulk potentials of each region, because the bulk potential quantifies the distance between the Fermi energy and the intrinsic energy. Capacitance impedance measurements of the diode in reverse bias gives, i.e. depletion capacitance, are invaluable to gain a knowledge of $V_{bi}$.

Figure 11:
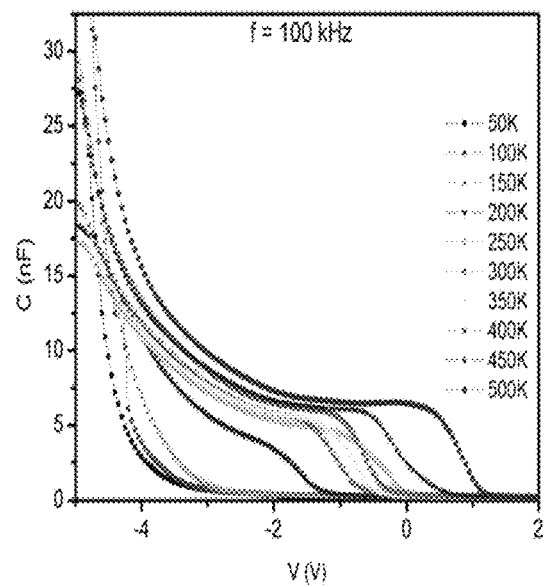
FIGS. 11 to 13 illustrate exemplary plots depicting variation in depletion layer capacitance of the sensor as a function of applied bias at 100 kHz, 400 kHz, and 1000 kHz, respectively.
Figure 12:
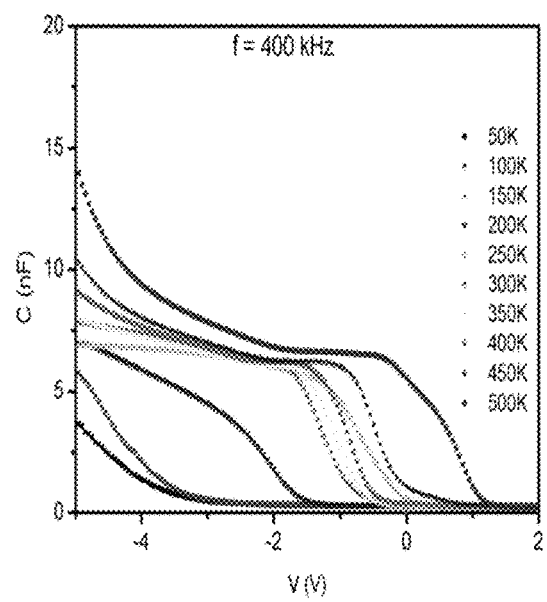
Figure 13:
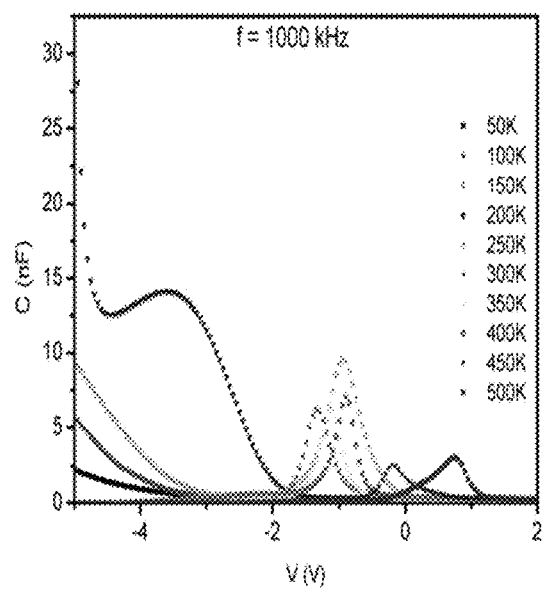
Figure 14:
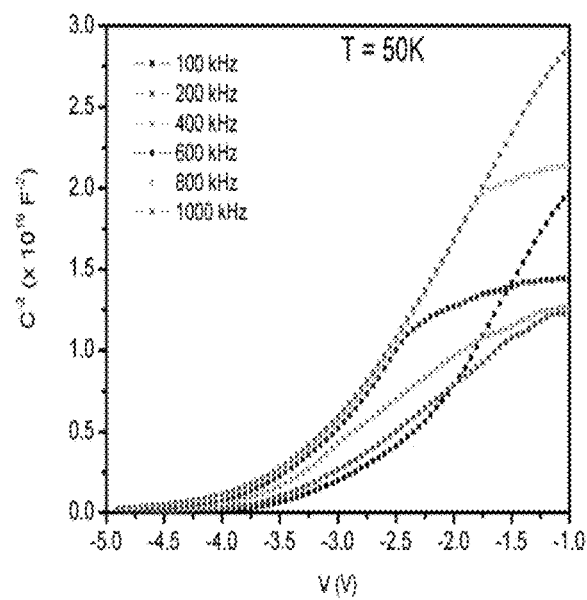
FIGS. 14 to 23 illustrate exemplary plots depicting variations of 1/C2 with reverse voltage and temperature.
Figure 15:
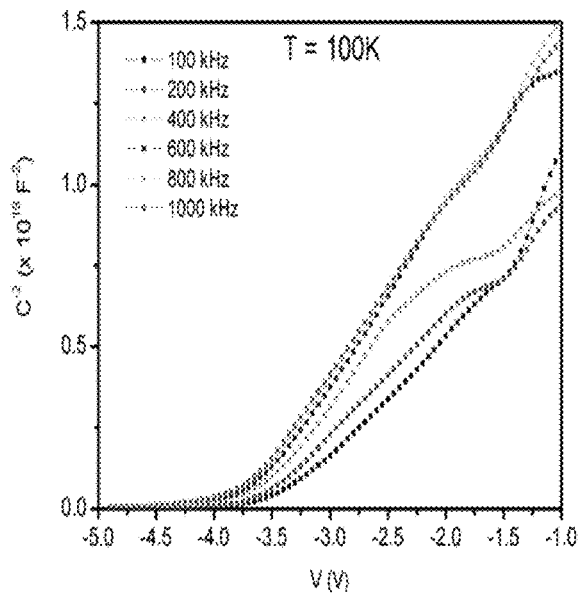
Figure 16:
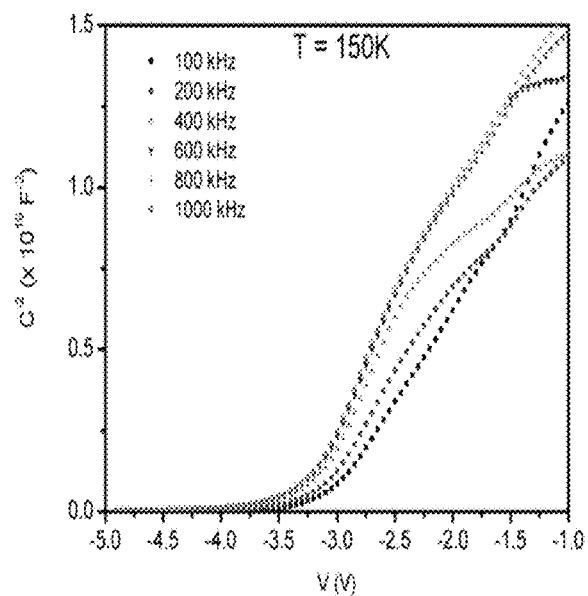
Figure 17:
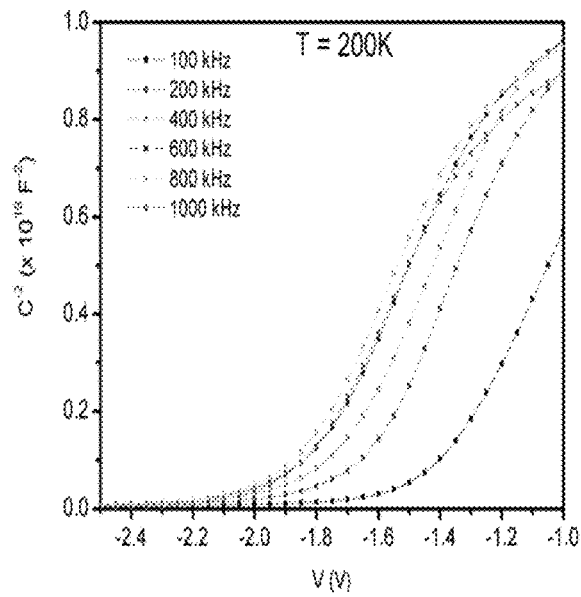
Figure 18:
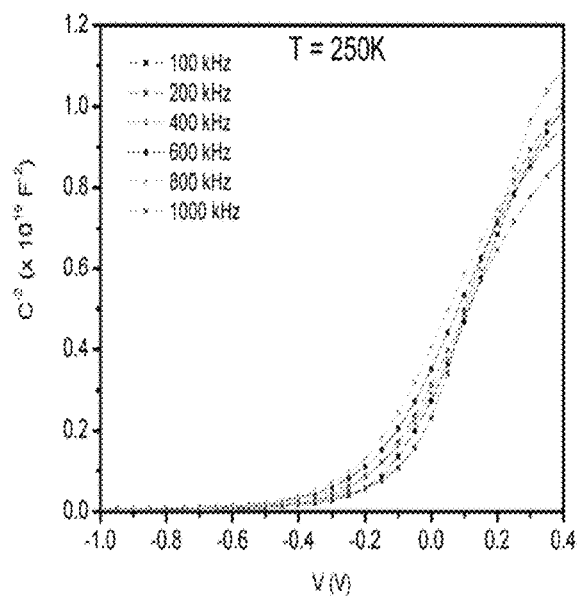
Figure 19:
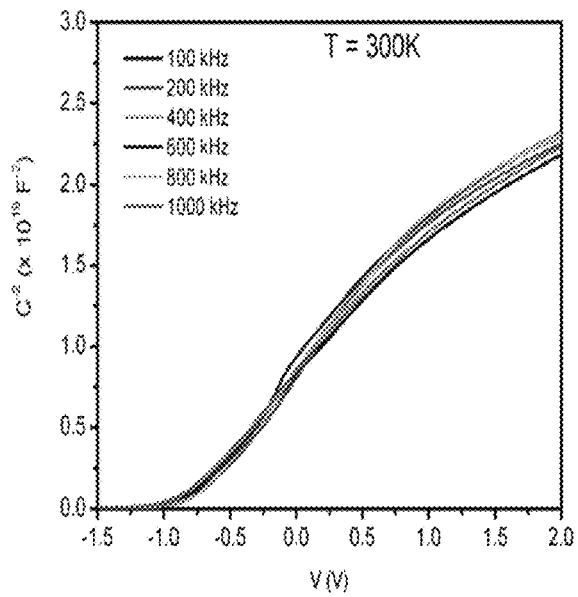
Figure 20:
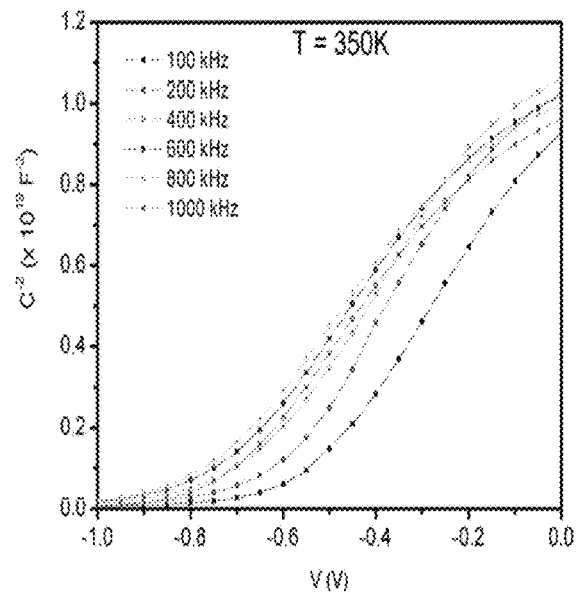
Figure 21:
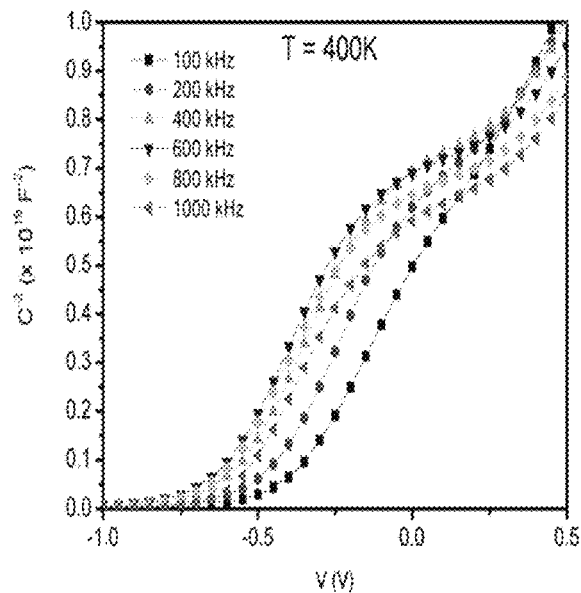
Figure 22:
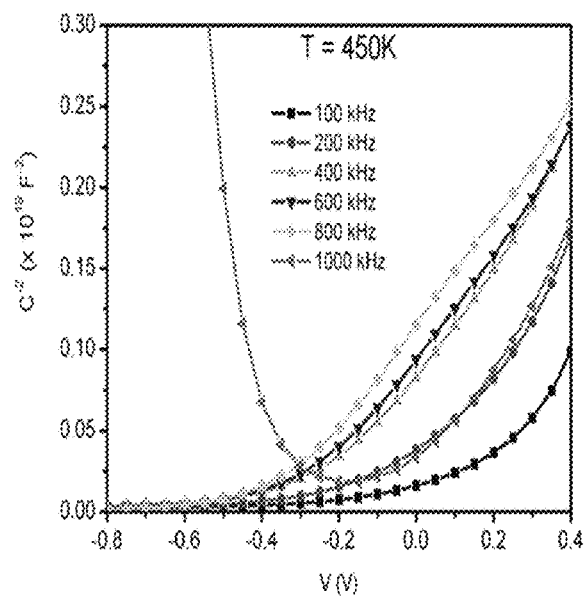
Figure 23:
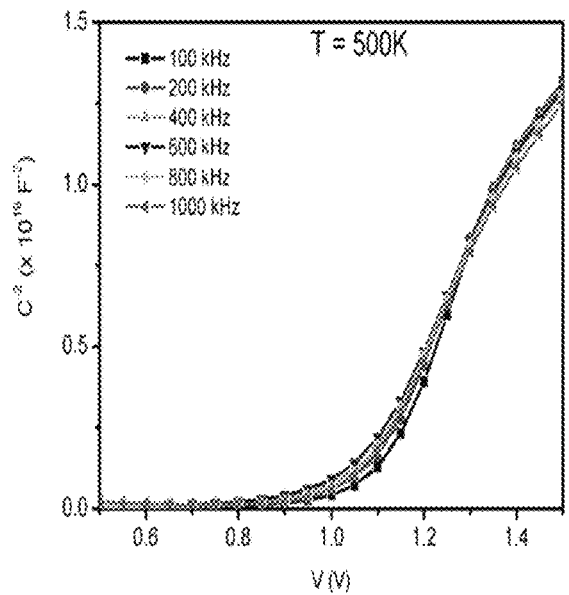

FIGS. 11 to 13 illustrate exemplary plots 1100, 1200, 1300 depicting variation in depletion layer capacitance of the sensor 100 as a function of applied bias at 100 kHz, 400 kHz, and 1000 kHz, respectively.

FIGS. 14 to 23 illustrate exemplary plots 1400 to 2300 depicting variations of 1/C2 with reverse voltage and temperature. Here, $V_{bi}$ can be determined at various conditions of thermal equilibrium.

To determine sensor performance, spectroscopic impedance measurements were done between 100 KHz and 1000 MHz at temperatures of 50K to 500K. The stimulation of the diode at reverse bias from −5 V to 5V was done using a low-distortion oscillator with on an output amplitude of 50 millivolts root mean square (rms).

Capacitance C can be expressed as, $$\frac{1}{C^2} = \frac{2(V_0 + V)}{q \varepsilon_s \varepsilon_0 A^2 N_A}$$

where A is the diode junction area, $\varepsilon_s$ is the dielectric constant of the semiconductor (11.8) and $\varepsilon_0$ is the permittivity of the vacuum, which equals 88.5 femtofarads per centimeter. Further, $$V_0 = V_{bi} - V_{th}$$

where $V_{bi}$ is the built-in diode voltage and $V_{th}$ is the thermal voltage of the junction, and equals kT. The plot of 1/C2 versus V ideally follows a linear variation from whose gradient $N_A$ can be calculated.

Figure 24:
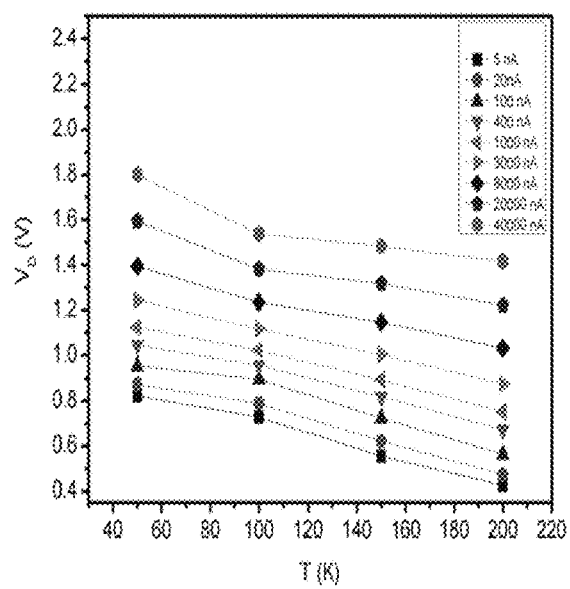
FIG. 24 illustrates an exemplary plot depicting a variation of the diode forward voltage versus temperature as empirically determined at various constant currents at cryogenic temperatures.

FIG. 24 illustrates an exemplary plot 2400 depicting a variation of the diode forward voltage versus temperature as empirically determined at various constant currents at cryogenic temperatures. The figure provides knowledge of the range of current over which the variation is linear, and also an estimate of the expected 0K diode voltage.

Figure 25:
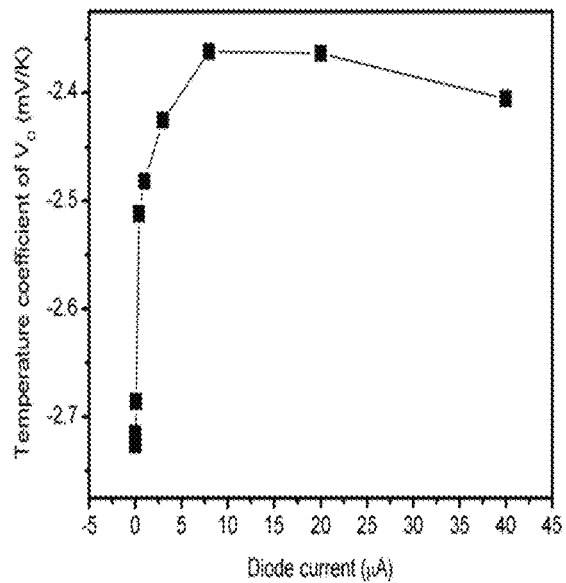
FIG. 25 illustrates an exemplary plot depicting gradients of the plot of FIG. 24 based on forward diode constant current.

FIG. 25 illustrates an exemplary plot 2500 depicting gradients of the plot 2400 of FIG. 24 based on forward diode constant current. Hence, at a specific voltage bias, the reverse diode current is given by, $$V = \alpha_V T + V_{0k}$$

Figure 26:
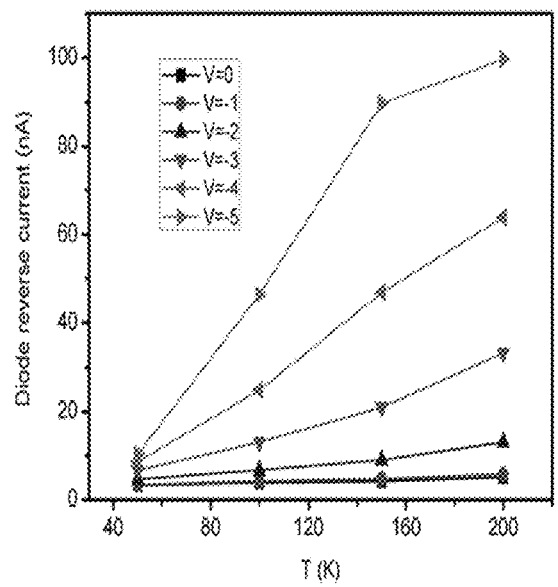
FIG. 26 illustrates an exemplary plot depicting linear variations of reverse diode current with cryogenic temperature under various bias voltages.

FIG. 26 illustrates an exemplary plot 2600 depicting linear variations of reverse diode current with cryogenic temperature under various bias voltages. It can be seen that the gradient depends on the applied bias voltage, suggesting that the detection sensitivity in the reverse bias mode is programmable by setting the reverse bias.

Figure 27:
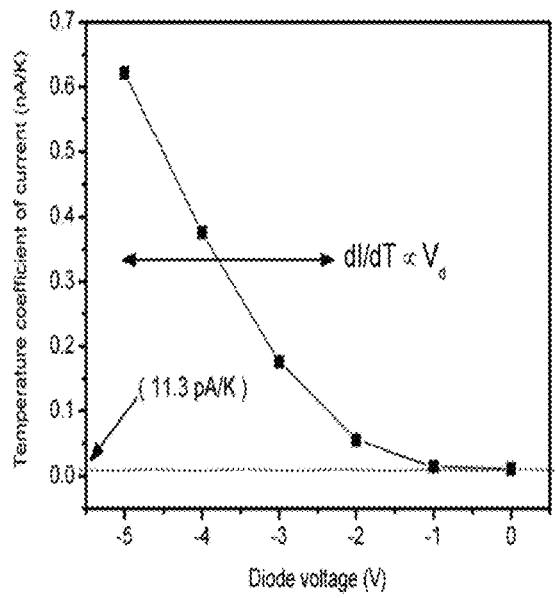
FIG. 27 illustrates an exemplary plot depicting dependence of temperature coefficient or current sensitivity on bias voltage.

FIG. 27 illustrates an exemplary plot 2700 depicting dependence of temperature coefficient or current sensitivity on bias voltage. Hence, at a specific voltage bias, the reverse diode current is given by, $$I = \alpha_I T + I_{0k}$$

where $\alpha_I$ is the coefficient determined from FIG. 27, and $I_{0k}$ is the minimum reverse saturation current that is always present in the diode at all temperatures.

Figure 28:
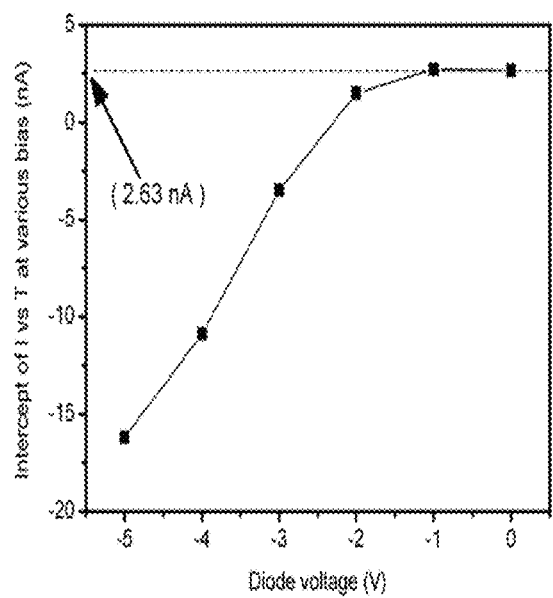
FIG. 28 illustrates an exemplary plot 2800 of diode voltage.

FIG. 28 illustrates an exemplary plot 2800 of diode voltage. It may be seen that $I_{0k}$ is 2.63 nA at zero bias.

Figure 29:
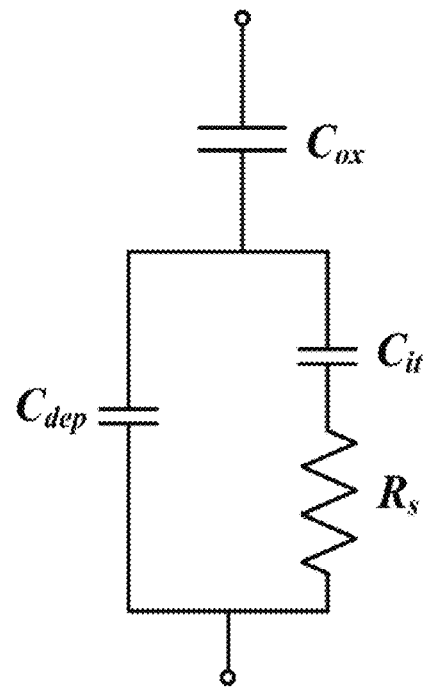
FIG. 29 illustrates a circuit depicting effective circuit model for the calculation of interface state density.
Figure 30:
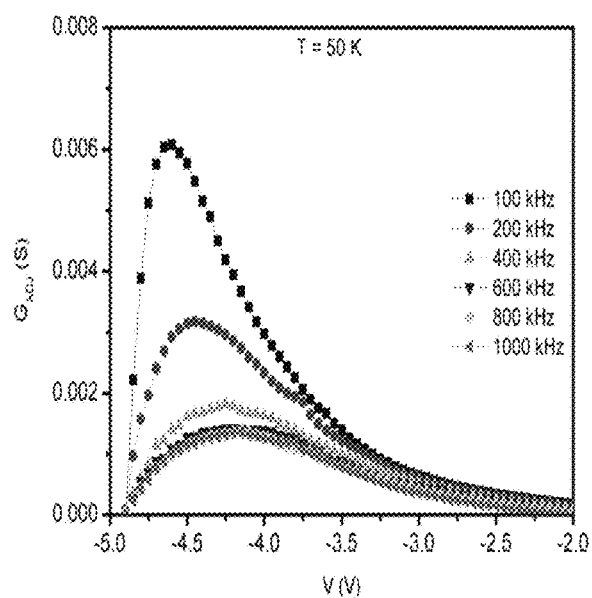
FIGS. 30 to 39 illustrate exemplary plots depicting series resistance compensated conductance for temperatures of 50K to 500K.
Figure 31:
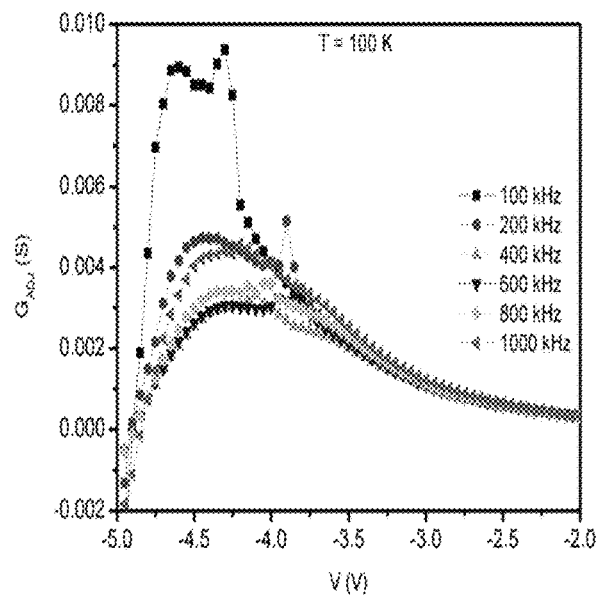
Figure 32:
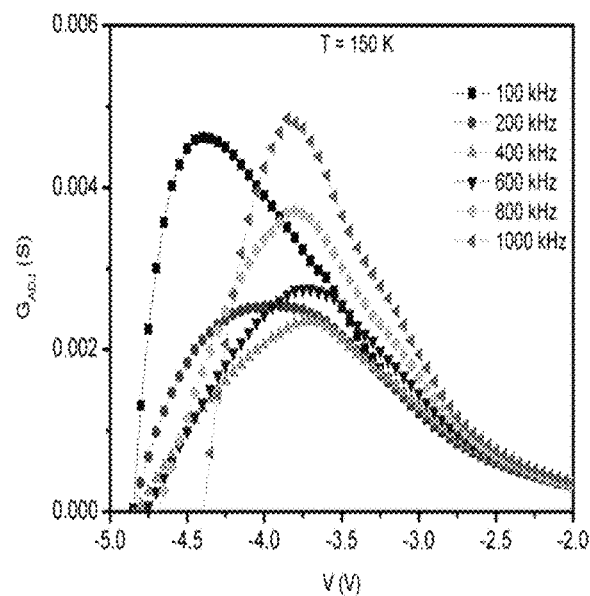
Figure 33:
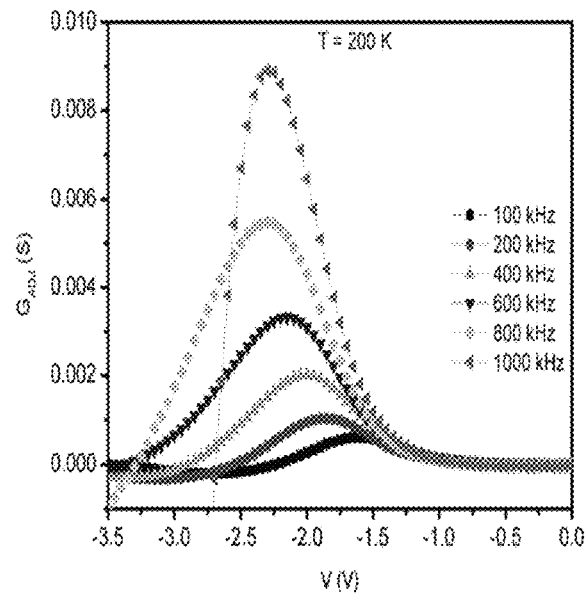
Figure 34:
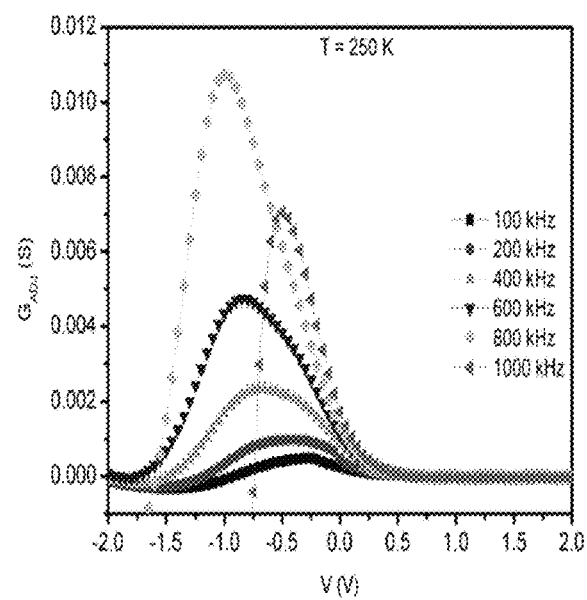
Figure 35:
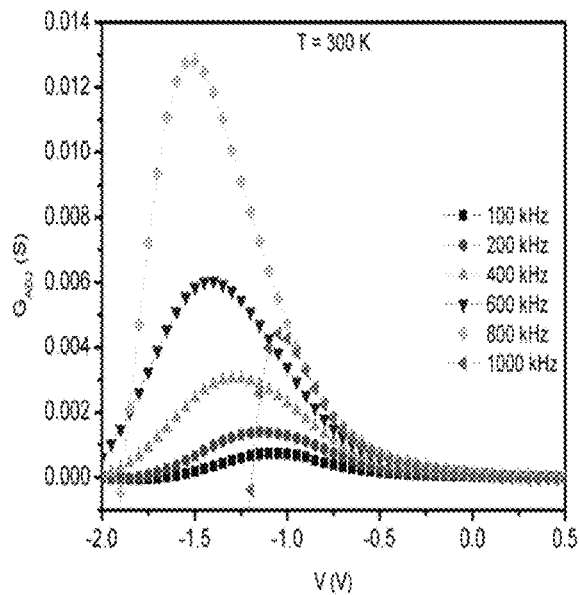
Figure 36:
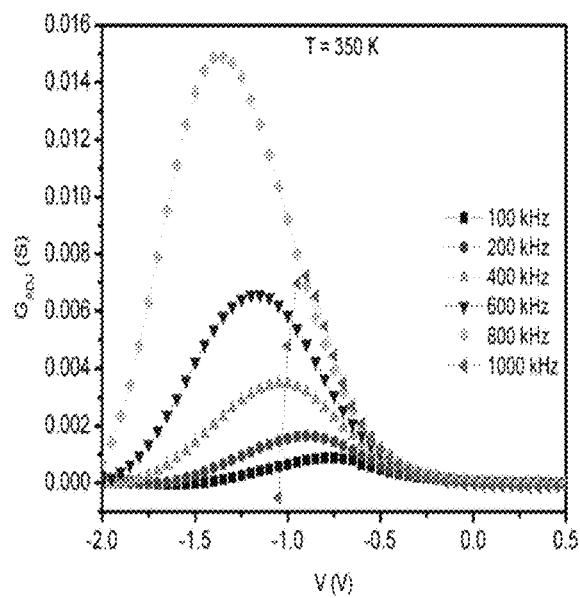
Figure 37:
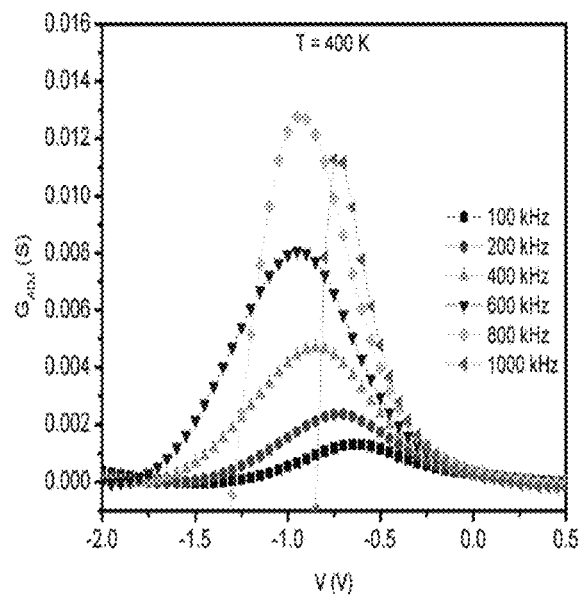
Figure 38:
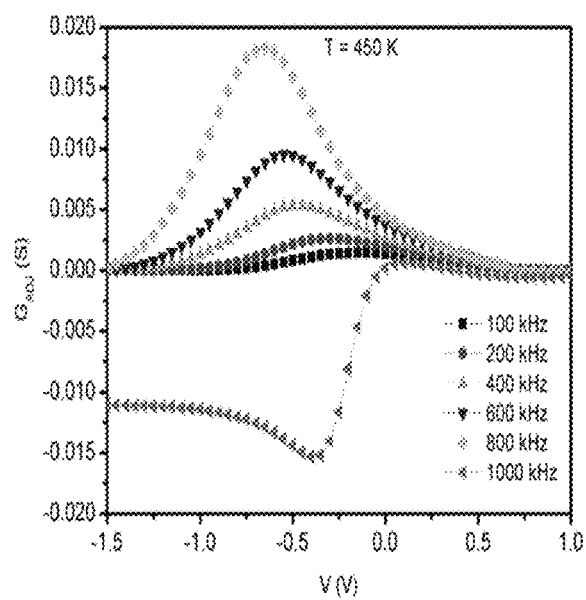
Figure 39:
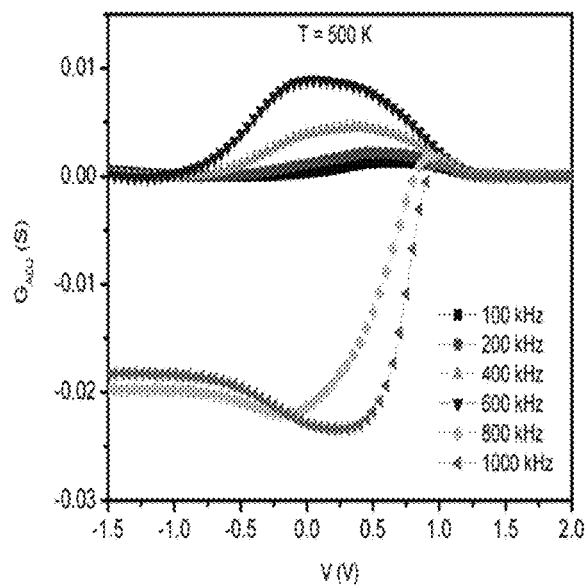

FIG. 29 illustrates a circuit 2900 depicting effective circuit model for the calculation of interface state density. FIG. 29 shows that for a sensor having interface states the capacitance of the interface states will effectively respond to frequency, thereby enabling its empirical determination through impedance spectroscopy.

FIGS. 30 to 39 illustrate exemplary plots 3000 to 3900 depicting series resistance compensated conductances for temperatures of 50K to 500K. The frequencies are scanned from 100 kHz to 1000 kHz to provide knowledge of the low, mid and high frequency behavior of interface states. The interface states are known to be sluggish to follow high frequency variations in a driving alternating current signal, causing discernible shifts in the CV and GV responses in the frequency domain.

Figure 40:
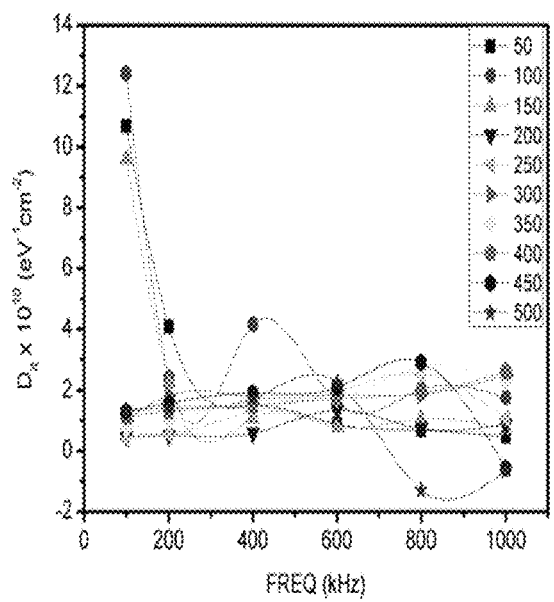
FIG. 40 illustrates an exemplary plot depicting density of interface states.

FIG. 40 illustrates an exemplary plot 4000 depicting density of interface states.

Figure 41:
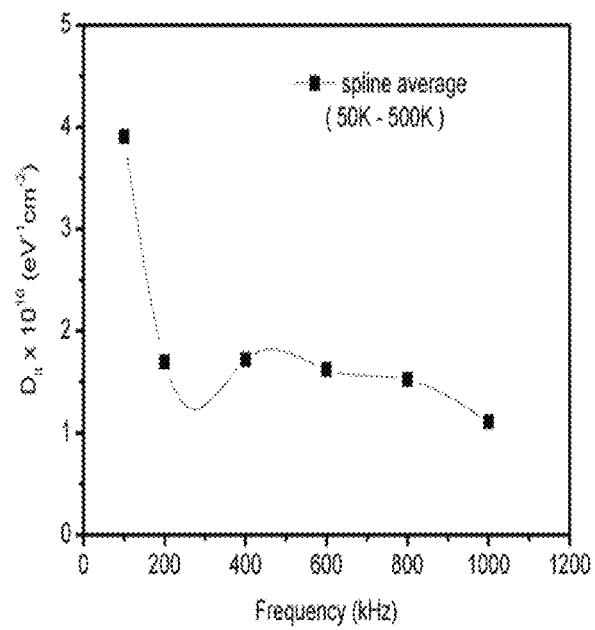
FIG. 41 illustrates an exemplary plot depicting an averaged plot of the density of interface states shown in plot of FIG. 40.

FIG. 41 illustrates an exemplary plot 4100 depicting an averaged plot of the density of interface states shown in plot 4000 of FIG. 40.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprise" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refer to at least one of something selected from the group consisting of A, B, C . . . and N, the text should be interpreted as requiring only one element from the group, not A plus N, or B plus N, etc. The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

While the foregoing describes various embodiments of the invention, other and further embodiments of the invention may be devised without departing from the basic scope thereof. The scope of the invention is determined by the claims that follow. The invention is not limited to the described embodiments, versions, or examples, which are included to enable a person having ordinary skill in the art to make and use the invention when combined with information and knowledge available to the person having ordinary skill in the art.

Advantages of Invention

The present invention provides a thin film sensor for cryogenic applications.

The present invention provides a thin film sensor for photoconductive and photovoltaic mode operation.

The present invention provides a thin film sensor for cryogenic applications with improved stability of operations.

The present invention provides a method for fabricating a thin film sensor for cryogenic applications.

We claim:

1. A thin-film sensor comprising:
a top layer passivation comprising top electrical contacts;
an active layer disposed under the top layer, the active layer comprising an active material;
a bottom layer passivation disposed below the active layer and comprising bottom electrical contacts; and
a semiconductor layer disposed around the active layer, such that the semiconducting layer sandwiches the active layer.

2. The thin-film sensor of claim 1, wherein the top electrical contacts are metallized with aluminum.

3. The thin-film sensor of claim 1, wherein the bottom electrical contacts are metallized with gold.

4. The thin-film sensor of claim 1, wherein the active material comprises graphitic carbon nitride.

5. The thin-film sensor of claim 1, wherein the semiconductor layer comprises silicon.

6. The thin-film sensor of claim 1, wherein the thin-film sensor works in a temperature range from about 50 K to about 500 K.

7. The thin-film sensor of claim 1, wherein the thin-film sensor is operable in forward and reverse bias.

* * * * *